United States Patent [19]

Kusakabe et al.

[11] Patent Number: 4,485,312
[45] Date of Patent: Nov. 27, 1984

[54] HYSTERESIS CIRCUIT

[75] Inventors: Hiromi Kusakabe; Yoshihiro Yoshida, both of Yokohama, Japan

[73] Assignee: Tokyo Shibaura Denki Kabushiki Kaisha, Kawasaka, Japan

[21] Appl. No.: 387,751

[22] Filed: Jun. 11, 1982

[30] Foreign Application Priority Data

Jun. 15, 1981 [JP] Japan ................................. 56-91987

[51] Int. Cl.³ ........................ H03K 3/29; H03K 5/153
[52] U.S. Cl. ................................... 307/290; 307/359; 307/354
[58] Field of Search ............... 307/290, 358, 359, 354, 307/494; 330/252, 273

[56] References Cited

U.S. PATENT DOCUMENTS

| | | | |
|---|---|---|---|
| 3,416,004 | 12/1968 | Taylor | 307/359 |
| 4,013,898 | 3/1977 | Makino | 307/362 |
| 4,162,454 | 7/1979 | Olsen | 307/354 |
| 4,210,827 | 7/1980 | Kanazawa et al. | 307/290 |
| 4,375,598 | 3/1983 | Sakai | 307/290 |

Primary Examiner—John S. Heyman
Assistant Examiner—Timothy P. Callahan
Attorney, Agent, or Firm—Cushman, Darby & Cushman

[57] ABSTRACT

A differential pair of first and second transistors for voltage comparison is provided, and a bias circuit for setting a reference voltage is connected to the base of the second transistor. A differential pair of third and fourth transistors is provided for reference voltage switching. The third and fourth transistors have their bases connected to the collectors of the first and second transistors and their collectors connected to the bias circuit in a positive feedback relation with respect to the base of the first transistor.

4 Claims, 2 Drawing Figures

F I G. 1
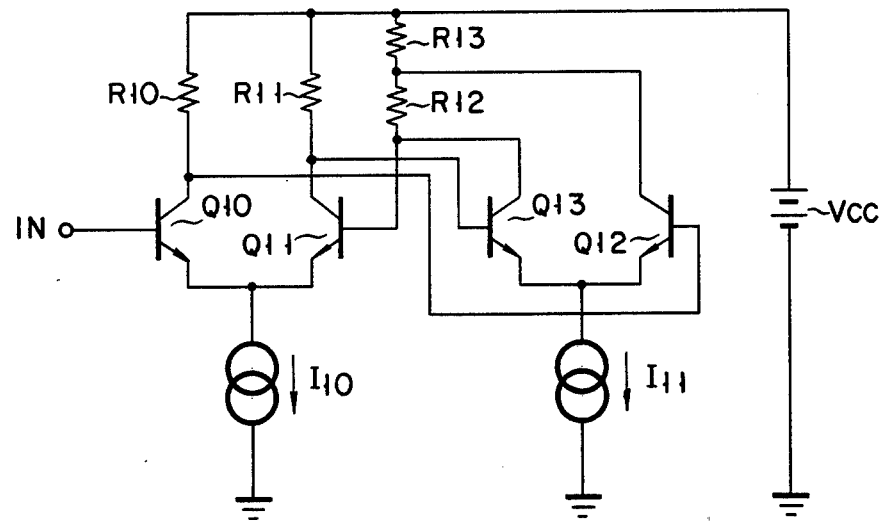
F I G. 2
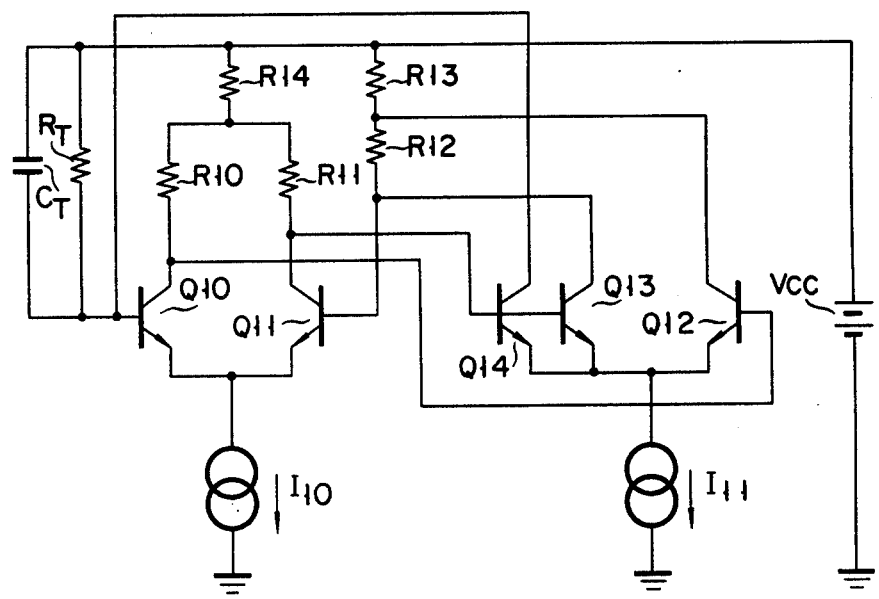

HYSTERESIS CIRCUIT

BACKGROUND OF THE INVENTION

The present invention relates to a hysteresis circuit suitable for a voltage-controlled oscillator or a Schmitt circuit.

Japanese Patent early publication No. 53-14285 discloses a hysteresis circuit which is provided with a differential pair of first and second transistors for voltage comparison. In this circuit, an input signal is supplied to the base of the first transistor and an output voltage of a voltage divider circuit connected across a reference voltage source is supplied to the base of the second transistor. The voltage divider circuit includes a switching transistor which is turned ON and OFF according to the input signal voltage. The base voltage of the second transistor is thus switched between a high voltage $V_H$ and a low voltage $V_L$.

With this circuit it is difficult to obtain a high speed response because the switching transistor driven into saturation is used. Also, power dissipation increases since a reference voltage source is necessary.

SUMMARY OF THE INVENTION

An object of the invention is to provide a hysteresis circuit which is suited for high speed response, can reduce power dissipation and is simple in construction.

According to the invention, a first differential pair of first and second transistors for voltage comparison is provided, and a bias circuit is provided for reference voltage setting between the base of the second transistor and a power supply terminal. Further, a second differential pair of third and fourth transistors for reference voltage switching is provided. The third and fourth transistors have their bases connected to the collectors of the first and second transistors and their collectors connected to the bias circuit so that the first and second differential pairs are connected in a positive feedback relation with respect to the base of the first transistor.

BRIEF DESCRIPTION OF THE DRAWINGS

FIG. 1 is a circuit diagram of a hysteresis circuit embodying the invention; and FIG. 2 is a circuit diagram of an oscillation circuit using the hysteresis circuit of FIG. 1.

DETAILED DESCRIPTION OF THE PREFERRED EMBODIMENT

FIG. 1 shows a hysteresis circuit embodying the invention. This circuit comprises a first differential pair of transistors Q10 and Q11 for voltage comparison and a second differential pair of transistors Q12 and Q13. Transistors Q10 and Q11 have their emitters connected through a current source I10 to a reference potential and their collectors connected to the positive terminal of a voltage source $V_{CC}$ through respective resistors R10 and R11. The base of transistor Q10 is connected to an input terminal IN to which an input signal is applied, and the base of transistor Q11 is connected to the voltage source $V_{CC}$ through a series connection of biasing elements, resistors R12 and R13 in this embodiment.

Transistors Q12 and Q13 have their emitters connected to a reference potential through a current source I11 and their collectors connected to a connection point between resistors R12 and R13 and the base of transistor Q11 respectively. The bases of transistors Q12 and Q13 are respectively connected to the collectors of transistors Q10 and Q11. Therefore, the first differential pair of transistors Q10 and Q11 and the second differential pair of transistors Q12 and Q13 are connected in a positive feedback relation when viewed from input terminal IN.

In the circuit arrangement described above, transistors Q12 and Q13 serve to switch the bias voltage applied to the base of transistor Q11. The resistance values of resistors R10 and R13 and the current values of current sources I10 and I11 are set such that each of transistors Q10 to Q13 is not driven into saturation.

The hysteresis function of the above circuit is achieved by switching the bias voltage applied to the base of transistor Q11. High and low hysteresis voltages $V_H$ and $V_L$ are determined as follows.

$V_H$ is a base voltage of transistor Q11 when transistor Q10 is nonconductive while transistor Q11 is conductive, i.e., when transistor Q12 is conductive while transistor Q13 is nonconductive. Taking the voltage source $V_{CC}$ as reference, it is given as $$V_H = -I11 \times R13$$

On the other hand, $V_L$ is a base voltage of transistor Q11 when transistor Q10 is conductive while transistor Q11 is nonconductive, i.e., when transistor Q12 is nonconductive while transistor Q13 is conductive. It is thus given as $$V_L = -I11 \times (R12 + R13)$$

In the above circuit, none of the transistors is driven into saturation so that high speed operation can be ensured. In addition, low power consumption can be expected because there is no need of providing any reference voltage source such as a zener diode. Since the transistors are not driven into saturation, undesired problems that might otherwise result due to parasitic elements in an integrated circuit can be precluded.

The hysteresis circuit shown in FIG. 1 can be used, for instance, for detecting the pilot signal in an FM stereo brodcast signal. In this case, a detection voltage varying with the amplitude of the pilot signal is supplied from a pilot signal detection circuit to the base of transistor Q10. The hysteresis circuit is used to drive a suitable display unit.

The hysteresis circuit shown in FIG. 1 can also be applied to an oscillating circuit as shown in FIG. 2. A parallel combination of a capacitor CT and a resistor RT is connected between the base of transistor Q10 and the positive terminal of voltage source $V_{CC}$. Further, a transistor Q14 is provided which has its collector connected to the base of transistor Q10, its emitter connected to the emitters of transistors Q12 and Q13 and its base connected to the collector of transistor Q11. Collector resistors R10 and R11 of transistors Q10 and Q11 are connected to voltage source $V_{CC}$ through a common resistor R14.

In this oscillating circuit, when the base voltage of transistor Q11 is $V_H$, the base voltage of transistor Q10 increases up to $V_H = V_{CC} - I11 \cdot R13$ with a time constant of CT·RT. When $V_H$ is reached by the base voltage of transistor Q10, transistor Q10 starts to conduct while transistor Q11 becomes nonconductive. As a result, transistor Q12 becomes nonconductive while transistors Q13 and Q14 start to conduct. Therefore, the base voltage of transistor Q11 becomes $$V'_L = V_{CC} - \frac{I11}{2}(R12 + R13)$$

I11/2 means that the current I11 is equally divided by transistors Q13 and Q14. Due to the conduction of transistor Q14, the base voltage of transistor Q10 is lowered abruptly to $V'_L$. When the base voltage of transistor Q10 becomes $V'_L$, transistor Q10 becomes nonconductive while transistor Q11 starts to conduct. Thus, the above operation is repeated to maintain oscillation. The base voltage waveform of transistor Q10 is a sawtooth wave varying between $V_H$ and $V'_L$. With such a circuit, all the transistors operate in a current mode so that high frequency oscillation is possible. This oscillation circuit is suited for use as a subcarrier signal generator in an integrated circuit FM multiplex stereo decoder.

The resistor R14, in the circuit of FIG. 2, is provided for preventing the saturation of transistors Q12, Q13 and Q14 by providing a constant level shift of R14·I10 to output signals of transistors Q10 and Q11. However, resistor R14 may be omitted by suitably selecting the signal amplitude.

For the purpose of using the oscillation circuit of FIG. 2 as, for instance, a voltage-controlled oscillator VCO used in a phase-locked loop (PLL), a voltage-controlled current source may be connected to the base of the transistor Q10. The output signal voltage may be taken from the collector of any transistor. However, it is also possible to obtain the output signal in current mode by providing an output transistor in parallel with transistor Q12 or transistors Q13 and Q14.

What we claim is:
1. A hysteresis circuit comprising:
a first differential pair of first and second transistors each having a collector, an emitter and a base with means for providing operative biasing thereof;
a second differential pair of third and fourth transistors each having a collector, an emitter and a base with means for providing operative biasing thereof;
a bias circuit connected between the base of said second transistor and a power supply terminal; and
means for connecting the collectors of said first and second transistors to the bases of said third and fourth transistors, respectively, and connecting the collectors of said third and fourth transistors to different potential points of said bias circuit, respectively, so that said first and second differential pairs are connected in a positive feedback relation with respect to the base of said first transistor when and input is applied thereto.

2. The hysteresis circuit according to claim 1 further comprising a parallel combination of a capacitor and a resistor connected between the base of said first transistor and said power supply terminal, and a fifth transistor having its base connected to the collector of said second transistor, its collector connected to the base of said first transistor and its emitter connected to the emitter of said fourth transistor.

3. The hysteresis circuit according to claim 1 or 2 wherein said bias circuit comprises a series combination of first and second biasing elements.

4. The hysteresis circuit according to claim 3 wherein said first and second biasing elements are each a resistor.

* * * * *